(12) United States Patent
Bruchhaus et al.

(10) Patent No.: US 7,348,619 B2
(45) Date of Patent: Mar. 25, 2008

(54) FERROELECTRIC MEMORY ARRANGEMENT

(75) Inventors: Rainer Bruchhaus, Munich (DE); Martin Gutsche, Dorfen (DE); Cay-Uwe Pinnow, Munich (DE)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 11/216,678

(22) Filed: Aug. 31, 2005

(65) Prior Publication Data

US 2006/0049440 A1    Mar. 9, 2006

(30) Foreign Application Priority Data

Aug. 31, 2004  (DE)  ............ 10 2004 042 174

(51) Int. Cl.
*H01L 27/108*  (2006.01)
*H01L 29/76*  (2006.01)
*H01L 29/94*  (2006.01)
*H01L 31/119*  (2006.01)

(52) U.S. Cl. ........................ 257/296; 257/295

(58) Field of Classification Search .......... 257/295, 257/296, E21.664; 438/3
See application file for complete search history.

(56) References Cited

U.S. PATENT DOCUMENTS

| | | | |
|---|---|---|---|
| 5,155,573 A * | 10/1992 | Abe et al. ................ 257/304 |
| 6,151,240 A | 11/2000 | Suzuki | |
| 6,198,119 B1 * | 3/2001 | Nabatame et al. .......... 257/295 |
| 6,300,652 B1 * | 10/2001 | Risch et al. ................ 257/296 |
| 6,468,812 B2 * | 10/2002 | Widmann et al. ............. 438/3 |
| 6,773,986 B2 * | 8/2004 | Bruchhaus et al. ......... 438/253 |
| 6,858,492 B2 * | 2/2005 | Bruchhaus et al. ......... 438/253 |
| 6,936,880 B2 * | 8/2005 | Park ........................... 257/306 |
| 6,943,080 B2 * | 9/2005 | Maruyama ................... 438/239 |
| 7,041,551 B2 * | 5/2006 | Zhuang et al. .............. 438/239 |
| 7,176,509 B2 * | 2/2007 | Maruyama et al. .......... 257/295 |
| 7,199,002 B2 * | 4/2007 | Hornik et al. .............. 438/240 |
| 2003/0151078 A1 | 8/2003 | Tanaka et al. | |
| 2005/0084984 A1 * | 4/2005 | Zhuang et al. ................. 438/3 |
| 2006/0046317 A1 * | 3/2006 | Bruchhaus et al. ............ 438/3 |

FOREIGN PATENT DOCUMENTS

EP    1 383 162 A2    1/2004

* cited by examiner

*Primary Examiner*—B. William Baumeister
*Assistant Examiner*—Igwe U. Anya
(74) *Attorney, Agent, or Firm*—Dicke Billig & Csaja, PLLC

(57) ABSTRACT

A ferroelectric memory arrangement having memory cells, in each of which a vertical ferroelectric storage capacitor, which includes vertical electrodes and a ferroelectric dielectric between the vertical electrodes, is connected to a select transistor, the ferroelectric dielectric a plurality of ferroelectric layers, between each of which is arranged an insulating separating layer.

15 Claims, 3 Drawing Sheets

($d_Z < d_{PZT}$)

Polarisation

FERROELECTRIC MEMORY ARRANGEMENT

CROSS-REFERENCE TO RELATED APPLICATIONS

This Utility Patent Application claims priority to German Patent Application No. DE 10 2004 042 174.9, filed on Aug. 31, 2004, which is incorporated herein by reference.

FIELD OF THE INVENTION

The invention relates to a ferroelectric memory arrangement comprising memory cells, in each of which a vertical ferroelectric storage capacitor, which includes vertical electrodes and a ferroelectric dielectric between the vertical electrodes, is connected to a select transistor.

BACKGROUND

The growth direction of the crystallites of the ferroelectric layer in the capacitor volume is becoming increasingly important with increasing miniaturization of the storage capacitors of ferroelectric data memories (FeRAMs). If the storage capacitor includes only one crystallite, the in-plane orientation of this crystallite is crucial for the switchable polarization and therefore the signal of the corresponding memory cell.

Hitherto, the dimensions of the ferroelectric capacitors have been so large, and therefore contain so many crystallites, that the directional dependency of the polarization has no effect. For two-dimensional capacitors with electrodes parallel to the substrate surface, the influence of this directional dependency, for the case of tetragonal PZT layers, can even been avoided altogether by an <111> texture.

SUMMARY

In one embodiment, the present invention provides a ferroelectric memory arrangement including memory cells, in each of which a vertical ferroelectric storage capacitor, which includes vertical electrodes and a ferroelectric dielectric between the vertical electrodes, is connected to a select transistor, the ferroelectric dielectric comprising a plurality of ferroelectric layers, between each of which is arranged an insulating separating layer, wherein a lateral dimension of the ferroelectric dielectric layers of each ferroelectric storage capacitor is of the order of magnitude of their crystallite size.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
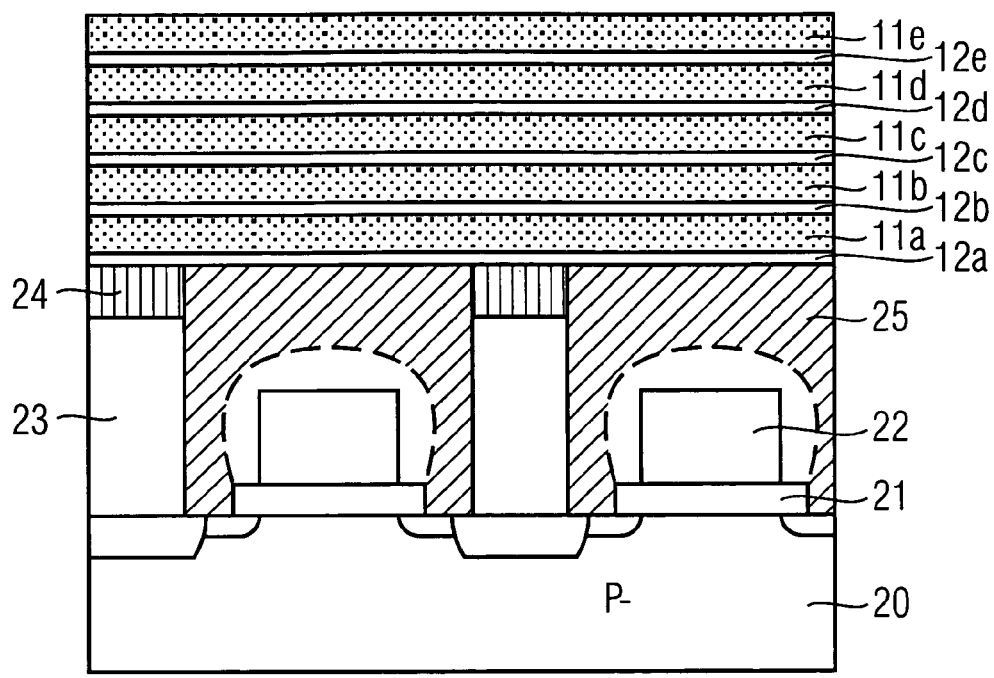
FIGS. 1A, 1B and 1C are diagrammatic cross-sectional views illustrating a process involved in the fabrication of ferroelectric storage capacitors of a ferroelectric memory arrangement according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a ferroelectric memory arrangement having vertical ferroelectric storage capacitors, in which the dimensions of the ferroelectric dielectrics located between the vertical electrodes in the lateral direction are approximately equal to the crystallite size of the ferroelectric dielectric material, so that the influence of the in-plane orientation of the crystallites on the polarization is reduced or eliminated altogether.

According to one embodiment, a ferroelectric memory arrangement includes a ferroelectric dielectric having a plurality of ferroelectric dielectric layers, between each of which is arranged an insulating separating layer.

In a ferroelectric memory arrangement of this type, in which the electrodes of the ferroelectric storage capacitors are arranged perpendicular to the substrate surface, the use of the insulating separating layers interrupts the growth of the ferroelectric dielectric layer. A further ferroelectric layer is applied to the insulating separating layer and crystallizes so as to establish a new in-plane orientation, which is very likely to differ from the orientation of the ferroelectric layer below. If a sufficient number of alternating double layers made up of insulating separating layer and ferroelectric dielectric layer are used, the influence of the in-plane orientation of the individual ferroelectric dielectric layer is averaged out. Suitable materials for the ferroelectric dielectric layer include PZT, $(Bi, La)_4Ti_3O_{12}$ or $(Sr, Bi)_2Ta_2O_9$. An oxidic material, such as for example $Al_2O_3$, $TiO_2$, $Ta_2O_5$, $CeO_2$ or $Y_2O_3$, or other suitable oxidic materials, can be used for the insulating separating layers.

In one embodiment of the ferroelectric memory arrangement according to the invention, the number of ferroelectric dielectric layers depends on their layer thickness and their crystallite size.

In one embodiment, the layer thickness of the individual ferroelectric dielectric layers to be greater than the layer thickness of the individual insulating separating layers.

Also, in one embodiment for the lateral dimension of the ferroelectric dielectric layers (and of the insulating separating layers) is approximately equal to their crystallite size.

In one embodiment, the ferroelectric storage capacitors are built up in such a way that the alternating layers of the ferroelectric dielectric and the separating layers lie horizontally, i.e., parallel to the substrate surface, between the vertical electrodes.

The alternating layered arrangement of ferroelectric dielectric layers with insulating separating layers between them which is proposed in accordance with the invention interrupts the crystal growth of the ferroelectric dielectric layer by means of the insulating separating layer. This prevents the in-plane orientation from being transferred during the growth of the ferroelectric layer.

In accordance with FIG. 1A, a bottom insulation layer 12a, for example of aluminum oxide, $TiO_2$, $Ta_2O_5$, $CeO_2$, $Y_2O_3$ or another suitable insulation material, is deposited over a lower, leveled section comprising the select transistors 21, which are implemented in a p-well 20 and the gate terminals of which are connected to bit or word lines 22 running perpendicular to the plane of the drawing, and having contact plugs 23, which are connected to controlled electrodes of the select transistors 21 and are closed off at the top by a contact metal 24, e.g., iridium. A first ferroelectric dielectric layer 11a is deposited over the bottom insulation layer 12a and crystallized. A second insulation layer, as first insulating separating layer 12b, is deposited over this bottom ferroelectric dielectric layer 11a, and this second insulation layer is then followed by another ferroelectric dielectric layer 11b, then another insulating separating layer 12c and so on alternately until the deposition and crystallization of a top ferroelectric dielectric layer 11e. The material of the ferroelectric dielectric layer may, for example, be PZT, $(Bi, La)_4Ti_3O_{12}$, $(Sr, Bi)_2Ta_2O_9$ or another suitable ferroelectric dielectric material. The thickness $d_{PZT}$ of each dielectric layer 11a-11e is greater than the thickness $d_Z$ of the insulating separating layers 12b-12e between them (cf. FIG. 2).

Figure 1B:
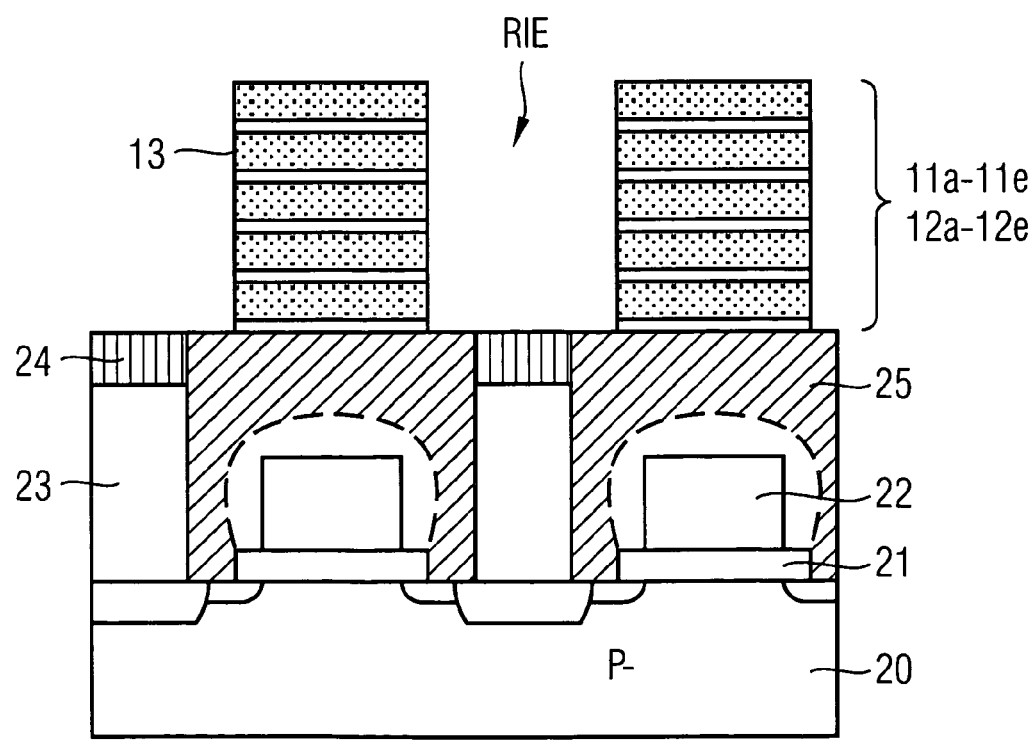
Figure 1C:
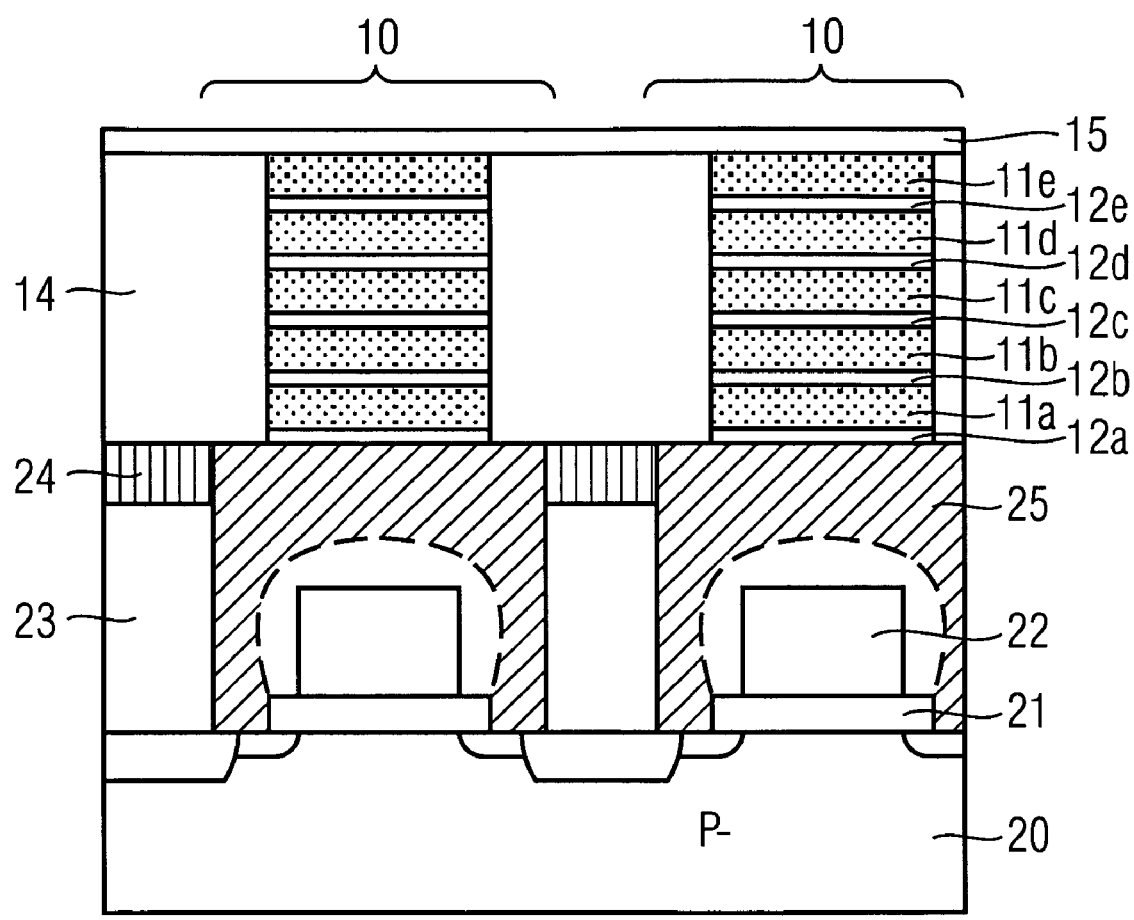

In reference to FIG. 1B, an opening is etched above the contact plugs 23, 24 as far as the intermediate oxide layer 25 by reactive ion etching (RIE), so that individual stacks comprising the plurality of ferroelectric dielectric layers 11a-11e and the insulating separating layers 12b-12e between them in each case remain in place above the select transistors 21. The openings 13 formed by RIE in FIG. 1B are then filled with electrode material for the vertical capacitor electrodes 14, as illustrated in FIG. 1C, and leveled to as far as the level of the top ferroelectric dielectric layer 11e. A hydrogen barrier 15, e.g., $Al_2O_3$ is deposited above this. Accordingly, FIG. 1C shows the finished product of the ferroelectric memory arrangement as far as the Back-End-Of-Line (BEOL) process steps. According to one embodiment of the invention, the width a measured in the horizontal direction (cf. FIG. 2) of the individual dielectric stacks of each ferroelectric storage capacitor 10 is approximately equal to the crystallite size of the material of the ferroelectric dielectric layers.

The method illustrated above can be used to realize a ferroelectric memory arrangement having 4F2 memory cells, where F is approximately 70 nm.

Figure 2:
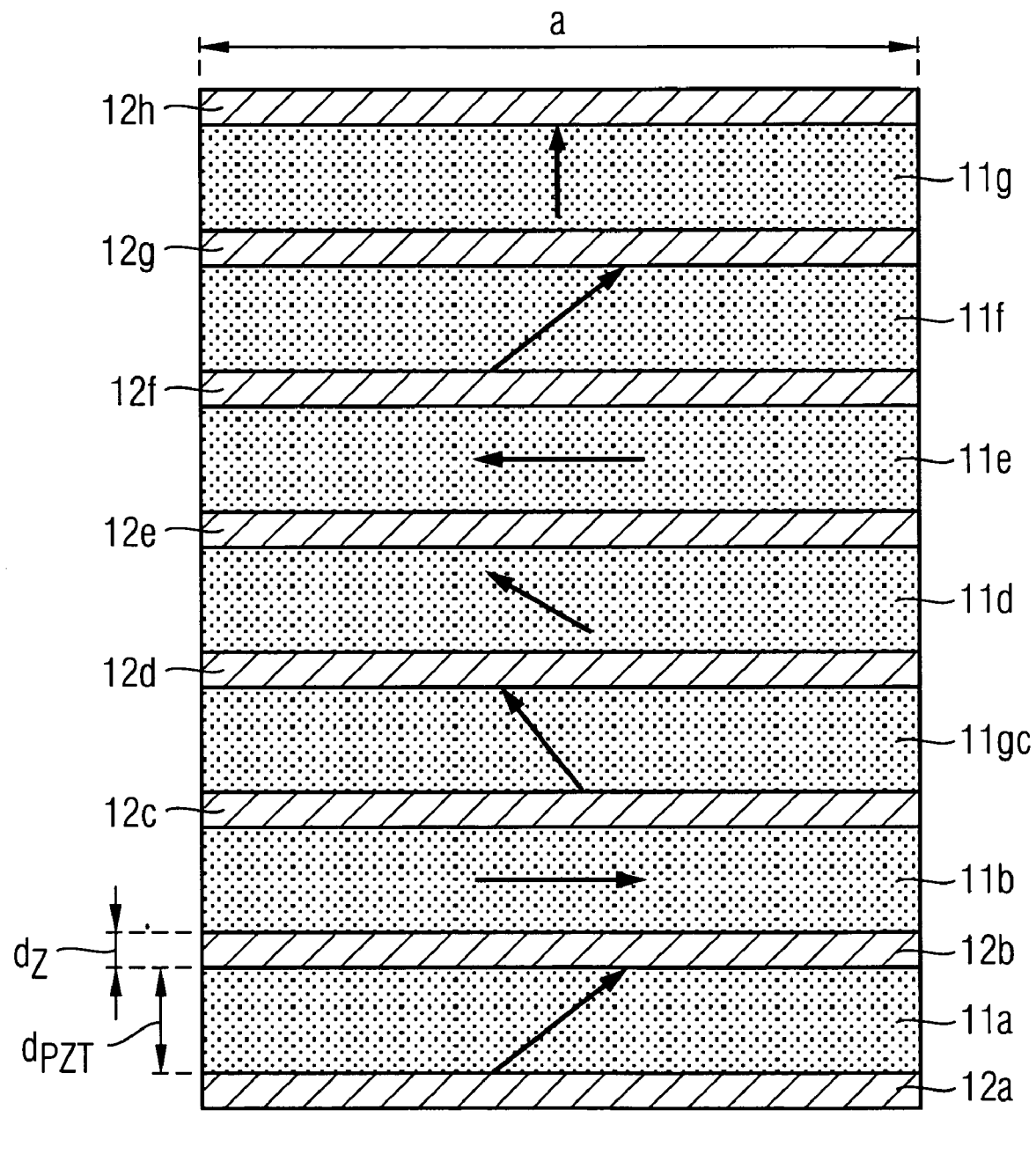
FIG. 2 diagrammatically depicts an illustration of the changing polarization directions in the individual ferroelectric dielectric layers separated by the insulating separating layers.
Figure 2:

FIG. 2 is a diagrammatic cross section illustrating how the directions of the polarization which occur in a plurality of ferroelectric dielectric layers 11a-11g which are located above one another and are separated by insulating separating layers 12b-12g average one another out if a sufficient number of ferroelectric dielectric layers separated by the insulating separating layers are applied. To achieve this effect, the number of ferroelectric dielectric layers is selected as a function of their layer thickness $d_{PZT}$ and their crystallite size. In a tetragonal ferroelectric material, the direction of the polarization axis tends to lie in the direction where the mechanical restriction is minimized. If the thickness $d_Z$ of the insulating separating layers 12b-12g is less than the thickness $d_{PZT}$ of the dielectric layers 11a-11g, the polarization acquires a strong component parallel to the substrate surface.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A ferroelectric memory arrangement comprising:
   a memory cell comprising:
     a select transistor; and
     a ferroelectric storage capacitor coupled to the select transistor, the ferroelectric storage capacitor including vertical electrodes, and a ferroelectric dielectric between the vertical electrodes, configured wherein a dimension of the ferroelectric dielectric in a lateral direction is approximately equal to a crystallite size of the ferroelectric dielectric material, and wherein the ferroelectric dielectric comprises a plurality of ferroelectric layers having an insulating separating layer between each adjacent ferroelectric layer.

2. The arrangement of claim 1, comprising wherein a lateral dimension of the plurality of ferroelectric layers is approximately equal to the crystallite size of the plurality of ferroelectric layers.

3. A ferroelectric memory arrangement comprising:
   a plurality of memory cells, each memory cell comprising:
     a vertical ferroelectric storage capacitor that includes vertical electrodes and a ferroelectric dielectric between the vertical electrodes, connected to a select transistor, the ferroelectric dielectric comprising a plurality of ferroelectric layers, between each of which is arranged an insulating separating layer, wherein a lateral dimension of the ferroelectric dielectric layers of each ferroelectric storage capacitor is of the order of magnitude of their crystallite size.

4. The memory arrangement of claim 3, wherein the ferroelectric dielectric layers are made of $Pb(Zr, Ti)O_3$ (PZT).

5. The ferroelectric memory arrangement of claim 3, wherein the ferroelectric dielectric layers are made of $(Bi, La)_4Ti_3O_{12}$.

6. The ferroelectric memory arrangement of claim 3, wherein the ferroelectric dielectric layers are made of $(Sr, Bi)_2Ta_2O_9$.

7. The ferroelectric memory arrangement of claim 3, wherein the material of the insulating separating layers are an oxidic material.

8. The ferroelectric memory arrangement of claim 7, wherein the material of the separating layers consists of $Al_2O_3$.

9. The ferroelectric memory arrangement claim 7, wherein the material of the separating layers consists of $TiO_2$.

10. The ferroelectric memory arrangement of claim 7, wherein the material of the separating layers consists of $Ta_2O_5$.

11. The ferroelectric memory arrangement of claim 7, wherein the material of the separating layers consists of $CeO_2$.

12. The ferroelectric memory arrangement of claim 7, wherein the material of the separating layers consists of $Y_2O_3$.

13. The ferroelectric memory arrangement of claim 3, wherein the layer thickness of the ferroelectric dielectric layers is greater than the layer thickness of the insulating separating layers.

14. The ferroelectric memory arrangement of claim 3, wherein the alternating layers of the ferroelectric dielectric and the separating layers are located horizontally between the vertical electrodes.

15. A ferroelectric memory arrangement comprising:
a plurality of memory cells, each memory cell comprising:
a vertical ferroelectric storage capacitor that includes vertical electrodes and a ferroelectric dielectric between the vertical electrodes, connected to a select transistor, the ferroelectric dielectric comprising a plurality of ferroelectric layers, between each of which is arranged an insulating separating layer, wherein a lateral dimension of the ferroelectric dielectric layers of each ferroelectric storage capacitor is of the order of magnitude of their crystallite size, wherein the number of ferroelectric dielectric layers is selected as a function of a thickness of the ferroelectric dielectric layer and crystallite size.

* * * * *